United States Patent [19]

Scheuenpflug

[11] Patent Number: 5,270,260

[45] Date of Patent: Dec. 14, 1993

[54] METHOD AND APPARATUS FOR CONNECTING A SEMICONDUCTOR CHIP TO A CARRIER SYSTEM

[75] Inventor: Richard Scheuenpflug, Kleinpruefening, Fed. Rep. of Germany

[73] Assignee: Siemens Aktiengesellschaft, Munich, Fed. Rep. of Germany

[21] Appl. No.: 985,447

[22] Filed: Dec. 3, 1992

Related U.S. Application Data

[63] Continuation of Ser. No. 728,514, Jul. 11, 1991, abandoned.

[30] Foreign Application Priority Data

Aug. 23, 1990 [DE] Fed. Rep. of Germany ....... 4026668

[51] Int. Cl.$^5$ .................................... H01L 21/60
[52] U.S. Cl. .................................... 437/209; 437/212; 437/205; 437/226
[58] Field of Search ............. 437/209, 211, 212, 226, 437/227, 205, 206, 207, 183, 220

[56] References Cited

U.S. PATENT DOCUMENTS

| | | | |
|---|---|---|---|
| 3,811,186 | 5/1974 | Larnerd et al. | 437/209 |
| 4,784,972 | 11/1988 | Hatada | 437/209 |
| 4,957,882 | 9/1990 | Shinomiya | 437/209 |

FOREIGN PATENT DOCUMENTS

| | | | |
|---|---|---|---|
| 3336606 | 4/1985 | Fed. Rep. of Germany | 437/226 |
| 0052229 | 4/1980 | Japan | 437/209 |
| 0050530 | 5/1981 | Japan | 437/226 |
| 58-25242 | 2/1983 | Japan | 437/183 |
| 0022339 | 2/1984 | Japan | 437/227 |
| 0210650 | 9/1986 | Japan | 437/226 |
| 62-47145 | 2/1987 | Japan | 437/209 |
| 0097346 | 5/1987 | Japan | 437/227 |
| 0030235 | 2/1989 | Japan | 437/209 |
| 0061923 | 3/1989 | Japan | 437/209 |
| 02-35782 | 2/1990 | Japan . | |
| 03-46242 | 2/1991 | Japan | 437/209 |
| 04-62596 | 12/1991 | Japan | 437/183 |

*Primary Examiner*—Brian E. Hearn
*Assistant Examiner*—Michael Trinh
*Attorney, Agent, or Firm*—Hill, Steadmand & Simpson

[57] ABSTRACT

A method and an apparatus for connecting a semiconductor chip to a carrier system, wherein the semiconductor chip that is already detached but is still situated in the wafer union and that is held on a self-adhesive foil is detached therefrom and move onto a prescribed connecting location on the carrier system and connected thereto. The placement of the semiconductor chip onto the carrier system involves considerably less expenditure of time and capital outlay than the prior art systems. The carrier system is provided with a joining material at the prescribed connecting locations. The wafer union on the self-adhesive foil is aligned such that the surface of a semiconductor chip to be connected lies opposite the location of the carrier system that is provided with the joining material. The semiconductor chip in the wafer union is brought to a spacing of $\leq 0.2$ mm above the carrier system and is ejected from the wafer union with a thrust mechanism onto the connecting location of the carrier system and is connected thereto. The method and the apparatus are particularly employed in SMD chip mounting.

6 Claims, 1 Drawing Sheet

METHOD AND APPARATUS FOR CONNECTING A SEMICONDUCTOR CHIP TO A CARRIER SYSTEM

This is a continuation of application Ser. No. 728,514, filed Jul. 11, 1991, now abandoned.

BACKGROUND OF THE INVENTION

The present invention is directed to a method and apparatus for connecting a semiconductor chip to a carrier system, whereby initially the semiconductor chip is detached but still situated in a wafer union and is attached to a self-adhesive foil. The semiconductor chip is then detached therefrom and placed onto a prescribed connecting location on the carrier system and is connected thereto.

In the prior art a die bonder or chip bonder is used for the automatic mounting of semiconductor chips or monolithic micromodules, respectively, on an assembly carrier. This bonder operates according to the "pick up" principle, i.e. the semiconductor chip that is already detached or isolated but still situated in the wafer union and that is applied on self-adhesive foil is lifted from below with a "pick up" needle. The lifted chip is then raised in the direction of the Z-axis, i.e. vertically, with a vacuum suction tweezers and is brought to the position of the assembly carrier, for example a leadframe, with linear and/or rotatory motion. The chip is then put in place on the assembly carrier or, respectively, on the carrier system with a further, downward motion in the Z-direction. The connection occurs by alloying, soldering or gluing.

However, depending on the application more or less long distances from the chip position to the mounting position are required as a result of this principle. The shortest time cycle currently known amounts to 0.4 s through 0.6 s per chip. In addition, a suction tweezers is required for removing and for transferring a respective chip. Damage to the semiconductor crystal and impurities due to particles as well as wear of the bonder head are caused by this principle. Overall, this prior art chip transfer system is too expensive, particularly in view of time, costs and material wear.

SUMMARY OF THE INVENTION

It is an object of the present invention to provide a method and an apparatus by which the placement of the semiconductor chip onto a carrier system occurs with significantly less time expenditure and capital outlay then prior art systems.

This object is inventively achieved by a method having the steps of: providing the carrier system with a joining material at the prescribed connecting locations; moving the detached semiconductor chip situated in the wafer union on self-adhesive foil to a slight distance of $\leq 0.2$ mm above the carrier system; aligning the wafer union such that the surface of a semiconductor chip to be connected lies opposite the prescribed connecting location of the carrier system that is provided with joining material; and ejecting the semiconductor chip from the wafer union with a thrust mechanism onto the connecting location of the carrier system that is provided with joining material and joining the semiconductor chip to carrier system.

The object is inventively achieved by an apparatus wherein: the carrier system is provided with a joining material at the prescribed connecting locations; the detached semiconductor chip situated in the wafer union on the self-adhesive foil is brought to a slight distance of $\leq 0.2$ mm above the carrier system guided on a X-Y table; the wafer union is aligned with an optoelectronic adjustment means relative to the carrier system guided on the X-Y table such that the surface of a semiconductor chip to be connected lies opposite the connecting location of the carrier system that is provided with the joining material; and a thrust mechanism is provided for pushing the semiconductor chip out of the wafer union onto the connecting location of the carrier system that is provided with joining material.

In advantageous developments of the method of the preferred embodiment a glue can be used as the joining material or a conductive adhesive can be used as the joining material. Furthermore, a semiconductor chip situated in the wafer union on the self-adhesive foil can be aligned with an optoelectronic adjustment means and a X-Y table such that the surface of the semiconductor chip to be connected lies opposite the prescribed connecting location of the carrier system provided with the joining material.

In advantageous developments of the apparatus of the preferred embodiment the carrier system can be a conductive band or a flip chip carrier. Also, the thrust mechanism can be a press pin.

It is assumed in the present invention that a semiconductor chip already isolated but still situated on adhesive foil in the wafer union is brought to a slight distance above the assembly carrier or, respectively, the carrier system. The wafer union is aligned or, respectively, adjusted on the self-adhesive foil such that the surface of the chip to be connected lies opposite the joining location of the carrier. The chip is then ejected from the wafer union with a "push down pin" and moved over a short distance of $\leq 0.2$ mm onto the carrier system that is preferably printed with glue as a joining material in the bonding region. The adhesive force of the glue is sufficient for accepting the chip that is now only slightly adhering to the foil due to the ejection event. This method is particularly suited for two types of chip connecting to a carrier system, namely for a face-up or, respectively, upside-up mounting, on the one hand, and, on the other hand, for an upside-down or, respectively, face-down mounting or, respectively, flip chip bonding.

In one version of the method, the chip has its back side joined to the semiconductor carrier or, respectively, carrier system. To that end, the wafer is sawed in a traditional method, namely to a residual thickness of 10 $\mu$m through 30 $\mu$m. The wafer situated on a foil, together with the foil, is then cut from a ring into which the foil is clamped and has its upper side glued onto a prepared, self-adhesive foil. The foil that is still situated at the back side is then pulled off in a "peel" process. Methods for reducing the adhesive force, for example with ultraviolet irradiation, are also possible. The wafer prepared in this manner is moved on a wafer carrier on a motor-driven X-Y table. The wafer is aligned with the assistance of an optoelectronic system and the first chip is brought into bonding position. The optoelectronic axis has been previously aligned with the mechanical bonding position. The assembly carrier or, respectively, the carrier system is then brought into the bonding position, is centered and fixed. The first chip is then pushed and fixed to the carrier system. A further adjustment of the chip over the carrier system is no longer required in further steps, since the grid prescribed by the sawing process and the step precision of the X-Y table of ±2.5 μm are adequate in order to bond the chips "blind". When "inked" wafers, i.e. wafers having faulty, marked chips, are to be processed, then what is referred to as a "wafer mapping" is provided, i.e. the positions of "good" and "bad" chips are transferred in the final measurement onto a data carrier allocated to the wafer. In this embodiment the die bonder then has a corresponding means in order to process this information.

In another version of the method, the chip has its front side connected to the semiconductor carrier or, respectively, carrier system. This type of chip mounting is also referred to as flip chip binding. Here, the sawn wafer can be introduced into the wafer receptacle of the X-Y table directly face down. Given a correspondingly designed carrier system (assembly carrier), the chip can be directly adjusted above the terminal positions of the carrier system (semiconductor carrier) with an optoelectronic system. To that end, the chips are expediently provided with an adjustment mark. This measure serves the purpose of enhancing the precision of the positioning of the semiconductor chip on the terminal contact bumps of the carrier system in order to keep the chip and contact pad size optimally small. When the applied flip chip is not surrounded by a housing, then a mechanical stabilization is produced on the basis of a plastic casting (for example, epoxy resin).

The advantages achieved with the present invention are that cycle times of ≦0.1 s/chip are achieved with the novel method and apparatus. The bonder head that was standard in the prior art (one of the most complicated parts of the bonding mechanism that is subject to the most wear because of the high accelerating forces) can thus be eliminated. A suction tweezers for transferring the semiconductor chip from the self-adhesive foil onto the carrier system is also no longer required.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
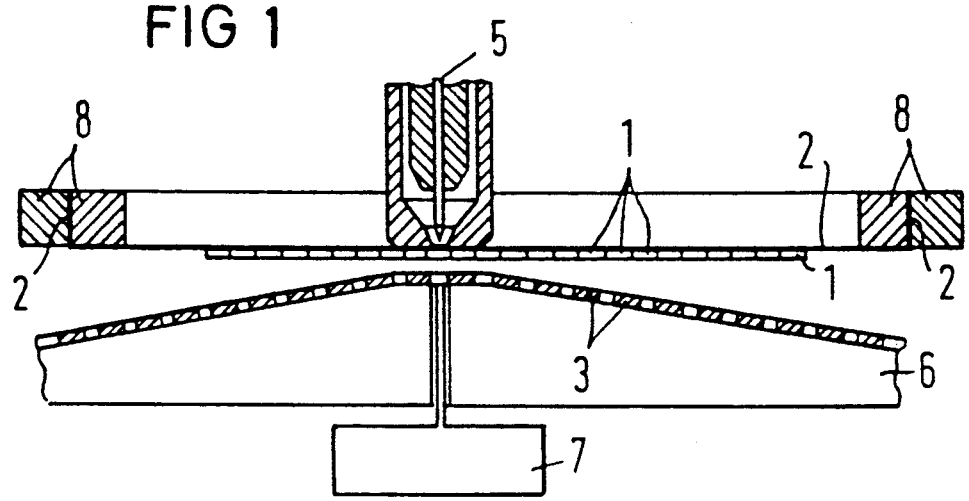
FIG. 1 is a cross-sectional view of an apparatus for connecting a semiconductor chip to a carrier system.
Figure 2:
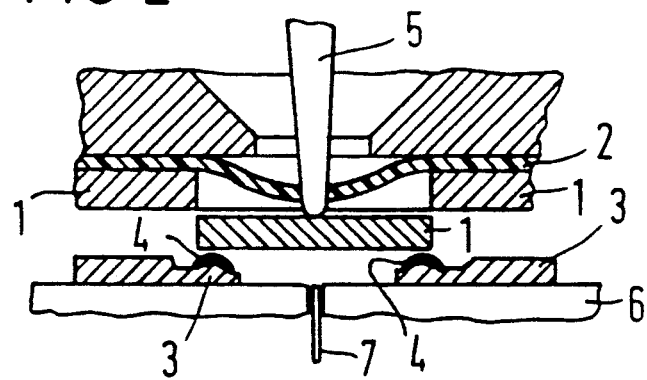
FIG. 2 is a cross-sectional view of a portion of the FIG. 1 apparatus in the operating condition of chip ejection.

The apparatus shown in FIGS. 1 and 2 for connecting a semiconductor chip 1 to a carrier system 3 is essentially composed of a X-Y table 6 for the acceptance and guidance of the carrier system 3 that is coupled to an optoelectronic adjustment mechanism 7 and of a thrust mechanism 5 for ejecting a respective semiconductor chip 1 that is already isolated from a wafer union and that is secured on a self-adhesive foil 2. The self-adhesive foil 2 together with the semiconductor chips 1 still situated in the wafer union is clamped in a tension ring 8. The carrier system 3, for example a conductive band and referred to as a leadframe or a flip chip carrier, is provided with a connecting material 4 (FIG. 2), preferably a conductive glue, for example a silver conductive glue, at prescribed joining locations. The isolated semiconductor chip 1 situated in the wafer union on the self-adhesive foil 2 is brought over the carrier system 3 that is guided on the X-Y table 6 at a slight distance of ≦0.2 mm thereover. The wafer union is thereby aligned with the optoelectronic adjustment means 7 relative to the carrier system 3 that is guided on the X-Y table and that the surface of a semiconductor chip 1 to be joined lies opposite a location of the carrier system 3 provided with glue as the joining material 4. A thrust mechanism 5 is arranged above the X-Y table for ejecting the semiconductor chip 1 from the wafer union in the direction of the location or, respectively, locations of the carrier system 3 provided with glue 4, whereby wafer union or, respectively, chip arrangement and carrier system 3 are arranged therebetween.

FIG. 2 illustrates the ejection process. The adhesive forces of the glue 4 are adequate for accepting the chip 1 that, due to the ejection process, adheres only slightly to the foil 2. The thrust mechanism 5 is expediently composed of an ejector pin, referred to as a push down pin, that is electromechanically driven.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for connecting a semiconductor chip to a carrier system, the semiconductor chip, being already detached from but still situated in a wafer union and being held in the wafer union by a self-adhesive foil, then being detached therefrom and placed onto a prescribed connecting location on the carrier system and connected thereto, comprising the steps of: providing the carrier system with a glue at the prescribed connecting location; moving the detached semiconductor chip situated in the wafer union on the self-adhesive foil to a slight distance of ≦0.2 mm above the carrier system; aligning the wafer union such that a surface of the detached semiconductor chip lies opposite the prescribed connecting location of the carrier system; and ejecting the semiconductor chip over said slight distance from the wafer union in a direction toward the prescribed connecting location with only a push down pin and onto the prescribed connecting location of the carrier system, the surface of the detached semiconductor chip contacting the glue and the detached semiconductor chip being thereby connected to the carrier system, the semiconductor chip being transferred from the wafer union to the carrier system due to adhesive forces of the self-adhesive foil and the glue in combination with the distance of ≦0.2 mm.

2. The method according to claim 1, wherein the glue is a conductive adhesive.

3. The method according to claim 1, wherein the detached semiconductor chip that is situated in the wafer union on the self-adhesive foil is aligned with an optoelectronic adjustment means and an X-Y table such that the surface of the detached semiconductor chip lies opposite the prescribed connecting location of the carrier system that is provided with the glue.

4. A method for connecting a semiconductor chip to a carrier system, the semiconductor chip, being already detached from but still situated in a wafer union and being held in the wafer union by a self-adhesive foil, the semiconductor chip to be detached therefrom and placed onto a prescribed connecting location on the carrier system and connected thereto, comprising the steps of: providing the carrier system with a glue at the prescribed connecting location; moving the detached semiconductor chip situated in the wafer union on the self-adhesive foil to a slight distance of $\leq 0.2$ mm above the carrier system; aligning the wafer union such that a surface of the detached semiconductor chip lies opposite the prescribed connecting location of the carrier system; and moving the semiconductor chip over said slight distance from the wafer union with a thrust mechanism to the prescribed connecting location of the carrier system, a surface of the semiconductor chip contacting the glue and the semiconductor chip being thereby connected to the carrier system, the semiconductor chip being transferred from the wafer union to the carrier system due to relative adhesive forces of the self-adhesive foil and the glue in combination with the distance of $\leq 0.2$ mm.

5. The method according to claim 4, wherein the glue is a conductive adhesive.

6. The method according to claim 4, wherein the detached semiconductor chip that is situated in the wafer union on the self-adhesive foil is aligned with an optoelectronic adjustment means and an X-Y table such that the surface of the detached semiconductor chip lies opposite the prescribed connecting location of the carrier system that is provided with the glue.

* * * * *